(12) United States Patent
Kim et al.

(10) Patent No.: US 8,623,519 B2
(45) Date of Patent: Jan. 7, 2014

(54) RED PHOSPHORESCENT COMPOUND AND ORGANIC ELECTROLUMINESCENT DEVICE USING THE SAME

(75) Inventors: Jung Keun Kim, Seoul (KR); Jeong Dae Seo, Incheon (KR); Kyung Hoon Lee, Seoul (KR); Chun Gun Park, Seoul (KR); Hyun Cheol Jeong, Jinju-si (KR); Jong Kwan Bin, Yongin-si (KR); Sung Hoon Pieh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1169 days.

(21) Appl. No.: 11/723,887

(22) Filed: Mar. 22, 2007

(65) Prior Publication Data

US 2007/0224450 A1    Sep. 27, 2007

(30) Foreign Application Priority Data

Mar. 23, 2006    (KR) .................. 10-2006-0026630

(51) Int. Cl.
*H01L 51/54*    (2006.01)
*C09K 11/06*    (2006.01)

(52) U.S. Cl.
USPC ........... 428/690; 428/917; 313/504; 313/506; 257/E51.044; 546/10

(58) Field of Classification Search
None
See application file for complete search history.

(56) References Cited

U.S. PATENT DOCUMENTS

| | | | | |
|---|---|---|---|---|
| 2001/0019782 A1* | 9/2001 | Igarashi et al. | ............... | 428/690 |
| 2003/0072964 A1* | 4/2003 | Kwong et al. | ............... | 428/690 |
| 2003/0096138 A1* | 5/2003 | Lecloux et al. | ............... | 428/690 |
| 2004/0140758 A1* | 7/2004 | Raychaudhuri et al. | ...... | 313/504 |
| 2005/0084707 A1* | 4/2005 | Satsuki et al. | ............... | 428/690 |

* cited by examiner

*Primary Examiner* — Marie R. Yamnitzky
(74) *Attorney, Agent, or Firm* — Morgan, Lewis & Bockius LLP

(57) ABSTRACT

A red phosphorescent compound of Formula I:

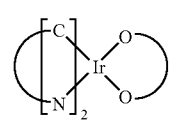

(1)

wherein

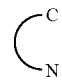

is

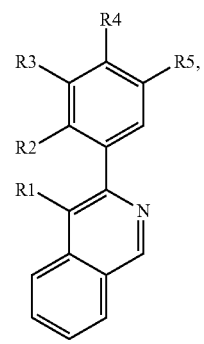

and R1, R2, R3, R4 and R5 are as defined in the specification.

7 Claims, 2 Drawing Sheets

CuPC

NPD (btp)$_2$Ir(acac)

BAlq

Alq$_3$

RED PHOSPHORESCENT COMPOUND AND ORGANIC ELECTROLUMINESCENT DEVICE USING THE SAME

This application claims the benefit of Korean Patent Application No. 10-2006-0026630 filed on Mar. 23, 2006, which is hereby incorporated by reference as if fully set forth herein.

BACKGROUND OF THE INVENTION

1. Field of the Invention

The present invention relates to a red light-emitting phosphorescent compound (hereinafter, referred to simply to as a 'red phosphorescent compound') and an organic electroluminescent (EL) device using the same. More particularly, the present invention relates to a red phosphorescent compound and an organic electroluminescent device realizing an improvement in color purity by using the red phosphorescent compound as a dopant of a light-emitting layer.

2. Discussion of the Related Art

Since electroluminescent devices are self-luminous display devices, they have the advantages of a wide viewing angle, a large contrast ratio, and a high response speed. Electroluminescent devices are divided into inorganic electroluminescent devices and organic electroluminescent devices depending upon the kind of the material for a light-emitting layer. Organic electroluminescent devices have advantages of high luminescence, low operation voltage, high response speed, and superior multi-color representation, as compared to inorganic electroluminescent devices.

When charge carriers are injected into an organic light-emitting layer formed between an electron injecting electrode (cathode) and a hole injecting electrode (anode) of an organic electroluminescent device, electrons combine with holes to create electron-hole pairs, which then decay to emit light. Organic electroluminescent devices have advantages in that they can be fabricated on flexible transparent substrates (e.g., plastic substrates) and can be operated at a voltage (e.g., 10V or below) lower than voltages required to operate plasma display panels (PDPs) and inorganic electroluminescent devices. Other advantages of organic electroluminescent devices are relatively low power consumption and excellent color representation. Further, since organic electroluminescent (EL) devices can emit light of three colors (i.e., green, blue and red), they have been the focus of intense interest lately as next-generation display devices capable of producing images of various colors. A general method for fabricating organic EL devices will be briefly explained below.

First, a transparent substrate is covered with an anode material. Indium tin oxide (ITO) is generally used as the anode material. A hole injecting layer (HIL) is laminated to a thickness of 10 to 30 nm on the anode. Copper (II) phthalocyanine (CuPc) is mainly used as a material of the hole injecting layer. Then, a hole transport layer is formed by depositing 4,4'-bis[N-(1-naphthyl)-N-phenylamino]-biphenyl (NPB) to a thickness of about 30 to about 60 nm on the hole injecting layer.

An organic light-emitting layer is formed on the hole transport layer. If necessary, a dopant may be added to a material for the organic light-emitting layer. For green light emission, tris(8-hydroxyquinoline)aluminum ($Alq_3$) as a material for the organic light-emitting layer is deposited to a thickness of about 30 to about 60 nm on the hole transport layer, and N-methylquinacridone (MQD) is mainly used as the dopant.

An electron transport layer (ETL) and an electron injecting layer (EIL) are sequentially laminated on the organic light-emitting layer. Alternatively, an electron injecting/transport layer is laminated on the organic light-emitting layer. In the case of green light emission, since $Alq_3$ has excellent electron-transport ability, the formation of the electron injecting/transport layer may be unnecessary. A cathode is deposited on the electron injecting layer, and finally a passivation film is covered thereon.

The type of the organic electroluminescent devices (i.e. blue, green and red light-emitting devices) will be determined depending on the kind of materials for the light-emitting layer.

In the light-emitting layer, holes injected from the anode are recombined with electrons injected from the cathode to form excitons. Singlet excitons and triplet excitons are involved in the fluorescence and phosphorescence processes, respectively. Fluorescent materials using triplet excitons, which are involved in the phosphorescence process, whose probability of formation is 75%, exhibit high luminescence efficiency, as compared to fluorescent materials using singlet excitons whose probability of formation is 25%. In particular, the luminescence efficiency of red phosphorescent materials is considerably high, compared to that of fluorescent materials. Accordingly, a number of studies associated with the use of red phosphorescent materials in organic electroluminescent devices are being made to enhance the luminescence efficiency of the organic electroluminescent devices.

Phosphorescent materials for use in organic EL devices must satisfy the requirements of high luminescence efficiency, high color purity and long luminescence lifetime. As shown in FIG. 1, as the color purity of an organic EL device using a red phosphorescent material becomes higher (i.e. as the x-values on CIE chromaticity coordinates increase), the spectral luminous efficacy of the organic EL device decreases, making it difficult to achieve high luminescence efficiency of the organic EL device.

SUMMARY OF THE INVENTION

Accordingly, the present invention is directed to a red phosphorescent compound and an organic electroluminescent (EL) device using the same that substantially obviate one or more problems due to limitations and disadvantages of the related art.

An object of the present invention is to provide a red phosphorescent compound that exhibits desirable chromaticity coordinate characteristics (CIE color purity X>0.65), high luminescence efficiency, and long luminescence lifetime.

Another object of the present invention is to provide an organic electroluminescent (EL) device using the red phosphorescent compound.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a red phosphorescent compound of Formula 1:

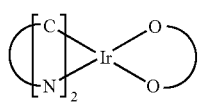

wherein

is

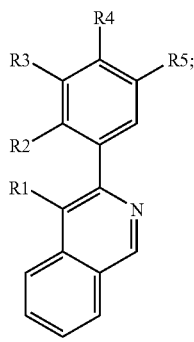

R1 is selected from the group consisting of $C_1$-$C_4$ alkyl and $C_1$-$C_4$ alkoxy; R2, R3, R4 and R5 are independently selected from the group consisting of hydrogen, $C_1$-$C_4$ alkyl and $C_1$-$C_4$ alkoxy; and

is selected from the group consisting of 2,4-pentanedione, 2,2,6,6,-tetramethylheptane-3,5-dione, 1,3-propanedione, 1,3-butanedione, 3,5-heptanedione, 1,1,1-trifluoro-2,4-pentanedione, 1,1,1,5,5,5-hexafluoro-2,4-pentanedione, and 2,2-dimethyl-3,5-hexanedione.

In another aspect of the present invention, there is provided an organic electroluminescent (EL) device comprising a light-emitting layer wherein the red phosphorescent compound of Formula 1 is used as a dopant for the light-emitting layer.

In yet another aspect of the present invention, there is provided an organic electroluminescent (EL) device comprising a first electrode, a light-emitting layer using a red phosphorescent compound as a dopant, and a second electrode, and exhibiting a luminescence of 1,300 to 1,450 cd/m² at an electric current of 0.8 to 1 mA and an applied voltage of 5.7 to 6.1 V.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
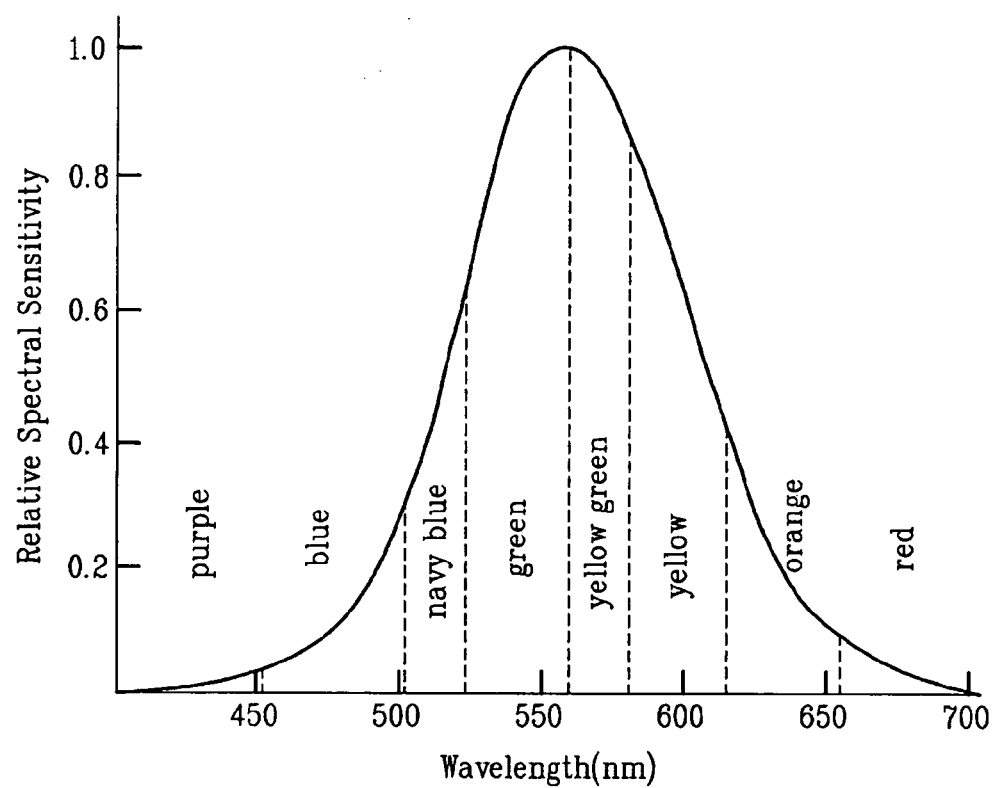
FIG. 1 shows a graph showing a phenomenon wherein the color purity of an organic EL device becomes higher (i.e. as the x-values on CIE chromaticity coordinates increase), the relative spectral sensitivity of the organic EL device decreases.
Figure 2:
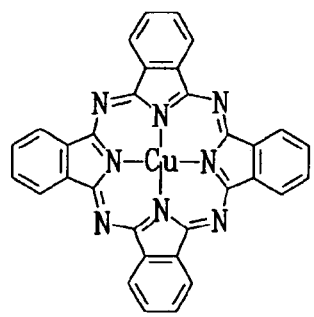
FIG. 2 shows the structural formulas of NPB, copper (II) phthalocyanine (CuPc), (btp)$_2$Ir(acac), Alq$_3$, BAlq, and CBP used in one embodiment of the red phosphorescent compound according to the present invention.
Figure 2:
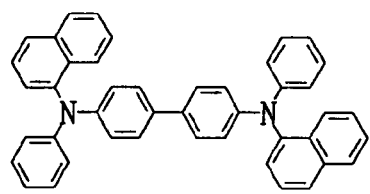
Figure 2:
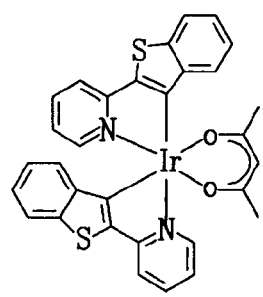
Figure 2:
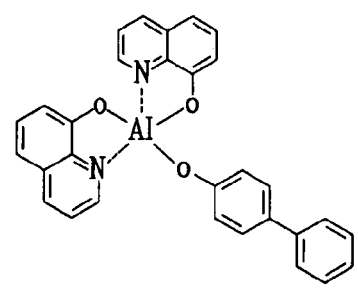
Figure 2:
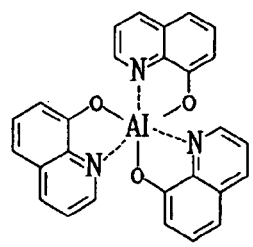

Reference will now be made in detail to the preferred embodiments of the present invention associated with a red phosphorescent compound and an organic electroluminescent (EL) device using the red phosphorescent compound according to the present invention, examples of which are illustrated in the annexed drawings.

The present invention provides a red phosphorescent compound of Formula 1:

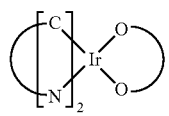

wherein

is

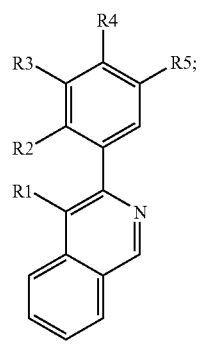

R1 is selected from the group consisting of $C_1$-$C_4$ alkyl and $C_1$-$C_4$ alkoxy; R2, R3, R4 and R5 are independently selected from the group consisting of hydrogen, $C_1$-$C_4$ alkyl and $C_1$-$C_4$ alkoxy; and

is selected from the group consisting of 2,4-pentanedione
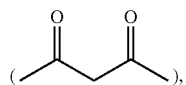
2,2,6,6,-tetramethylheptane-3,5-dione
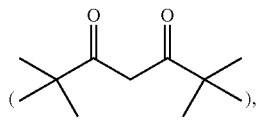
1,3 propanedione
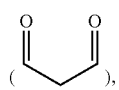
1,3-butanedione
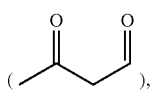
3,5-heptanedione
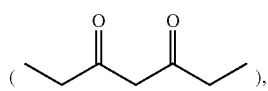
1,1,1-trifluoro-2,4-pentanedione
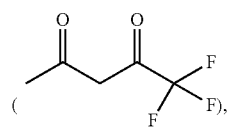
1,1,1,5,5,5-hexafluoro-2,4-pentanedione
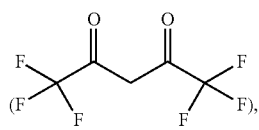
and 2,2-dimethyl-3,5-hexanedione
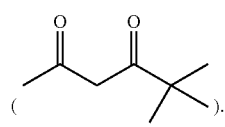
in Formula 1 is selected from the following compounds:
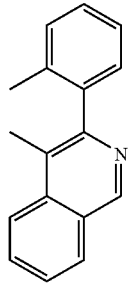
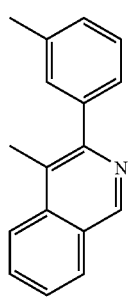
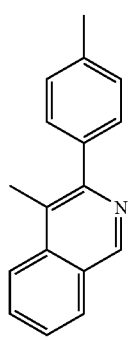
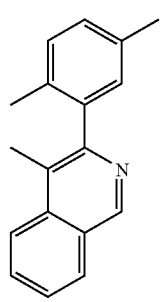
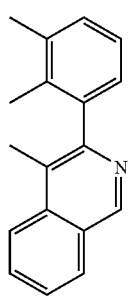

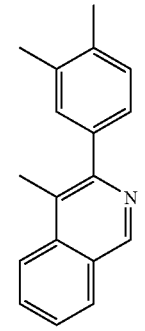
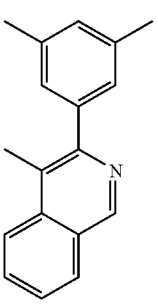
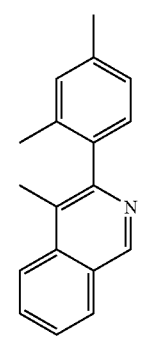
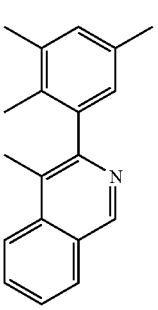
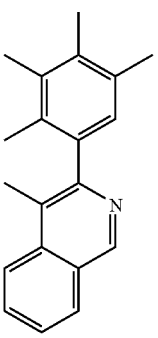
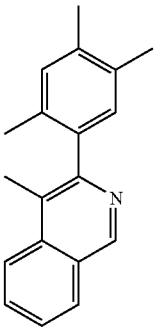
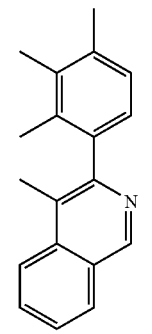
Examples of preferred compounds that can be represented by Formula 1 include the following compounds:
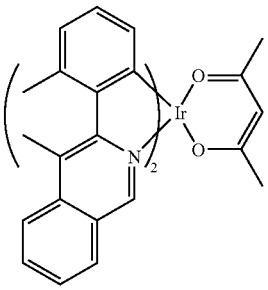
A-1
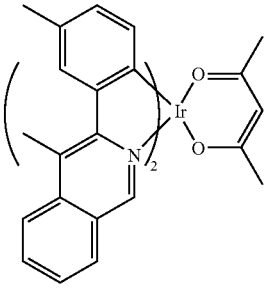
A-2
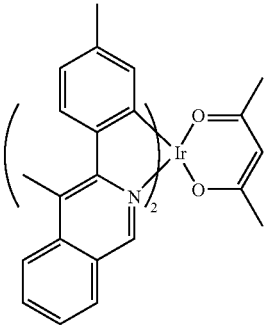
A-3

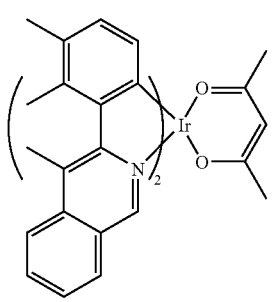
A-4
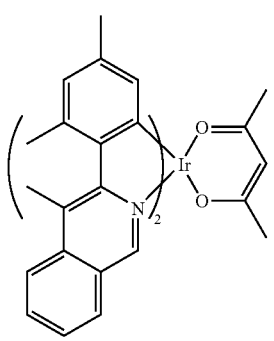
A-5
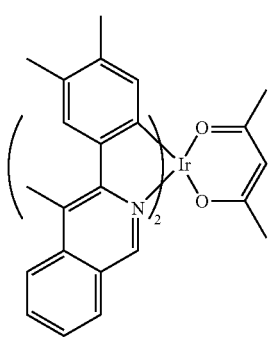
A-6
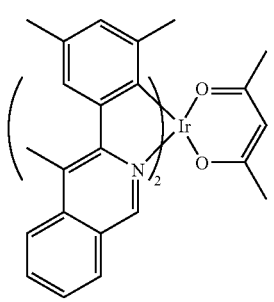
A-7
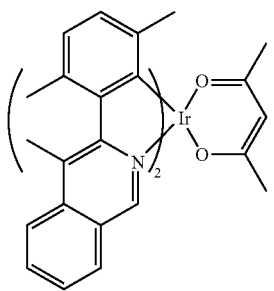
A-8
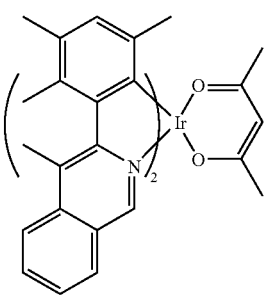
A-9
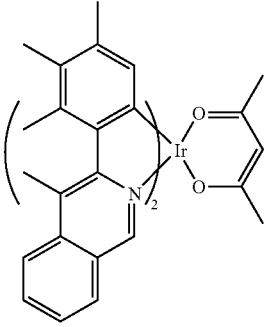
A-10
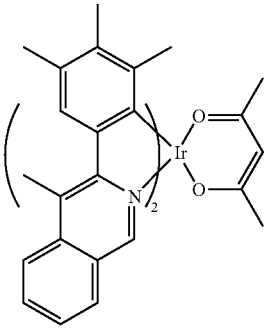
A-11
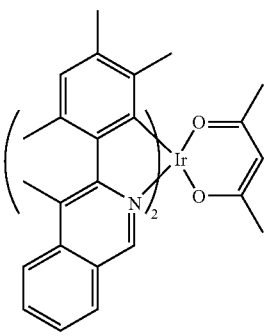
A-12
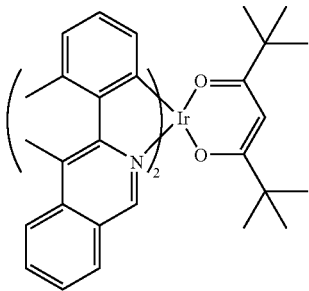
B-1

B-2
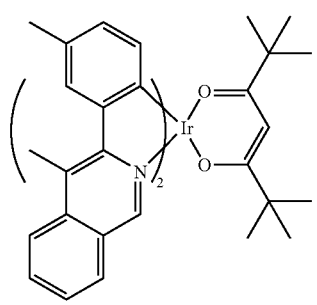
B-3
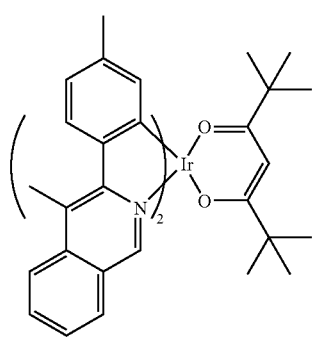
B-4
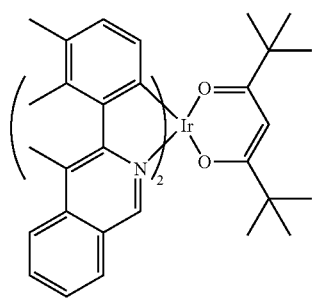
B-5
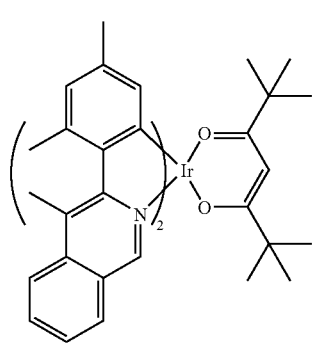
B-6
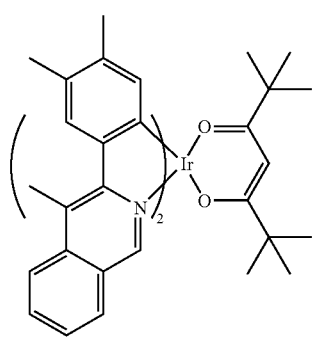
B-7
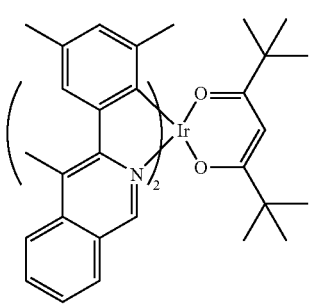
B-8
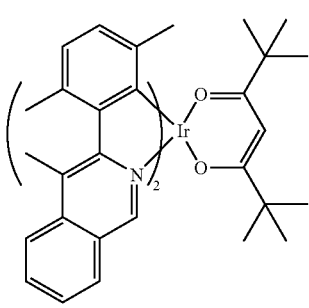
B-9
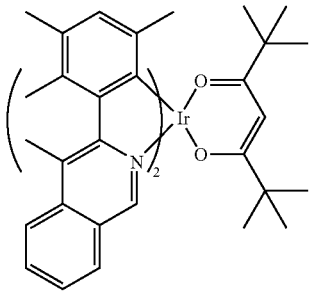
B-10
B-11
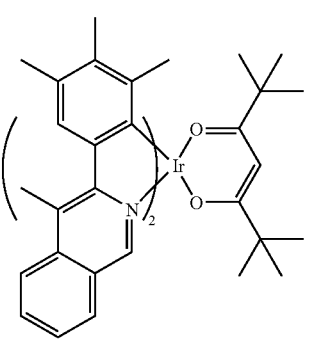

B-12

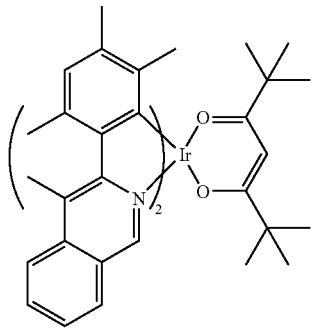

Further, the present invention provides an organic electroluminescent (EL) device comprising an organic light-emitting layer wherein the red phosphorescent compound of Formula 1 is used as a dopant for the organic light-emitting layer.

A host used in the organic light-emitting layer of the organic EL device according to the present invention may be selected from Al complexes, Zn complexes, and carbazole derivatives. The red phosphorescent compound of Formula 1 may be used as the dopant in an amount of 0.5 to 20% by weight. When the dopant is used within this range, improvements in chromaticity coordinate characteristics (CIE color purity X≥0.65), high luminescence efficiency, and long luminescence lifetime of the organic EL device can be realized. The Al and Zn complexes may have at least one ligand selected from the group consisting of quinol, biphenyl, isoquinol, phenyl, methylquinol, dimethylquinol and dimethylisoquinol. The carbazole derivatives may be preferably 4,4'-N,N' dicarbazole biphenyl (CBP).

Hereinafter, a method for synthesizing iridium (III) (3-(3,5-dimethylphenyl)-4-methylisoquinolinato-N,$C^{2'}$)(2,4-pentanedionate-O,O) ("A-7"), which is a red phosphorescent compound represented by Formula 1 according to the present invention.

Synthesis Example

1. Synthesis of 3-(3,5-dimethylphenyl)-4-methylisoquinoline

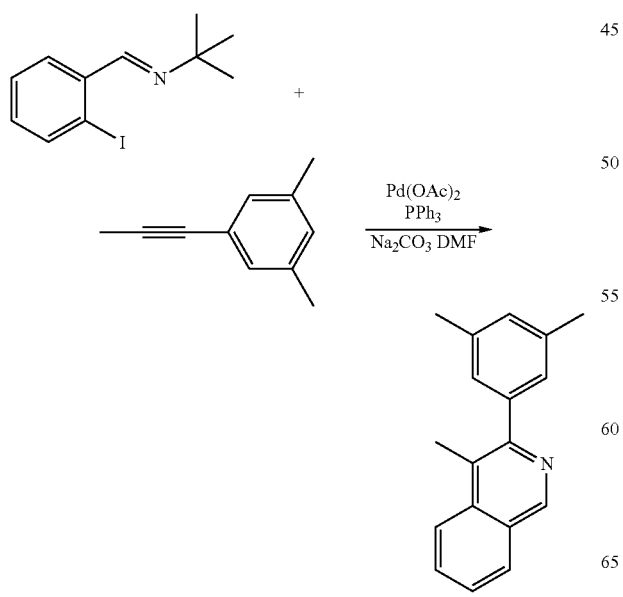

Propane-2-yl-benzene (100 mmol), acetic acid palladium (2.7 mmol), triphenylphosphine (5 mmol), and sodium carbonate (50 mmol) were put in a dried two-neck round-bottom flask and dissolved in DMF (100 ml). Subsequently, tert-butyl-(2-iodo-benzylidene)amine (50 mmol) was added thereto. The resulting solution was stirred in a bath at 100° C. for 24 hours. After completion of the reaction, the temperature was allowed to cool to room temperature. The reaction mixture was extracted with ether and saturated $NH_4Cl$. The extract was distilled under reduced pressure. The resulting residue was purified by silica gel column chromatography (hexane: EtOAc=5:1) to yield 3-(3,5-dimethylphenyl)-4-methylisoquinoline.

2. Synthesis of Dichloro-Crosslinked Dimer Complex

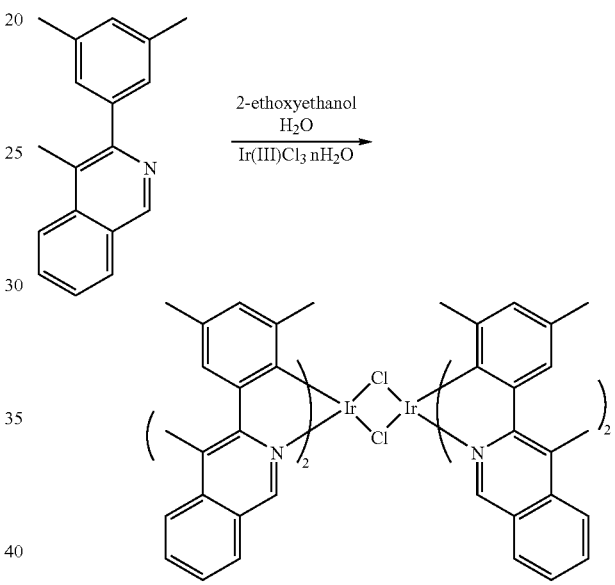

Iridium (III) chloride hydrate (1 mmol), 3-(3,5-dimethylphenyl)-4-methylisoquinoline (2.5 mmol), and a mixed solvent (3:1) of ethoxyethanol and distilled water were put in a dried two-neck round-bottom flask. After the mixture was refluxed for 24 hours, water was added thereto. The resulting solid was filtered, followed by washing with methanol and petroleum ether to yield the dichloro-crosslinked dimer complex.

3. Synthesis of iridium (III) 3-(3,5-dimethylphenyl)-4-methylisoquinato-N,$C^{2'}$)(2,4-pentanedionate-O,O)

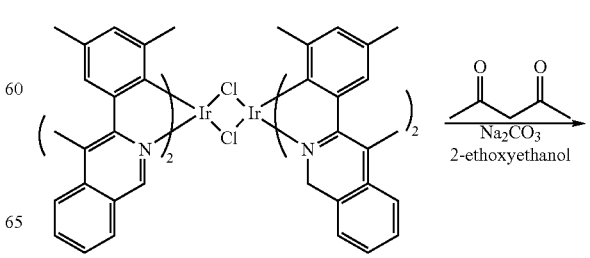

-continued

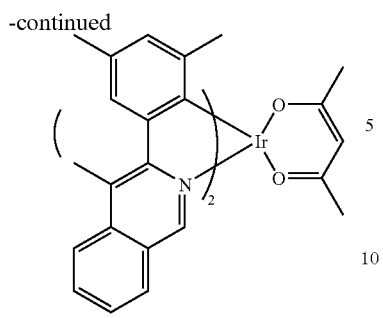

The dichloro-crosslinked dimer complex (1 mmol), 2,4-pentanedione (3 mmol), Na$_2$CO$_3$ (6 mmol) and 2-ethoxyethanol (30 mL) were put in a dried two-neck round-bottom flask. Then, the mixture was refluxed for 24 hours. After the temperature was allowed to room temperature, distilled water was added thereto to obtain a solid. The solid was filtered and dissolved in dichloromethane. The solution was filtered through silica gel. The solvent was distilled off under reduced pressure and the residue was washed with methanol and petroleum ether to yield the compound.

Hereinafter, a detailed description will be made of preferred examples associated with the organic electroluminescent (EL) device according to the present invention. More specifically, the examples relate to an organic electroluminescent (EL) device comprising an organic light-emitting layer which uses the red phosphorescent compound of Formula 1 as a dopant. The invention is not to be construed as being limited to the examples.

EXAMPLES

Example 1

An ITO-coated glass substrate was patterned to have a light-emitting area of 3 mm×3 mm, followed by cleaning. After the patterned substrate was disposed in a vacuum chamber, the standard pressure of the chamber was adjusted to 1×10$^{-6}$ torr. CuPc (200 Å), NPD (400 Å), BAlq+A-1 (7%) (200 Å), Alq$_3$ (300 Å), LiF (5 Å) and Al (1,000 Å) were sequentially deposited on the ITO glass substrate to fabricate an organic EL device.

The luminance of the organic EL device thus fabricated was 1,326 cd/m$^2$ at an electric current of 0.9 mA and a voltage of 6.1 V. At this time, the CIE chromaticity coordinates were x=0.601 and y=0.327. The lifetime (defined as the time taken before the luminance of the organic EL device decreases to half its initial value) of the organic EL device was 3,700 hours at 2,000 cd/m$^2$.

Example 2

An ITO-coated glass substrate was patterned to have a light-emitting area of 3 mm×3 mm, followed by cleaning. After the patterned substrate was disposed in a vacuum chamber, the standard pressure of the chamber was adjusted to 1×10$^{-6}$ torr. CuPc (200 Å), NPD (400 Å), BAlq+A-2 (7%) (200 Å), Alq$_3$ (300 Å), LiF (5 Å) and Al (1,000 Å) were sequentially deposited on the ITO glass substrate to fabricate an organic EL device.

The luminance of the organic EL device thus fabricated was 1,420 cd/m$^2$ at an electric current of 0.9 mA and a voltage of 5.7 V. At this time, the CIE chromaticity coordinates were x=0.592 and y=0.330. The lifetime (defined as the time taken before the luminance of the organic EL device decreases to half its initial value) of the organic EL device was 4,200 hours at 2,000 cd/m$^2$.

Example 3

An ITO-coated glass substrate was patterned to have a light-emitting area of 3 mm×3 mm, followed by cleaning. After the patterned substrate was disposed in a vacuum chamber, the standard pressure of the chamber was adjusted to 1×10$^{-6}$ torr. CuPc (200 Å), NPD (400 Å), BAlq+A-4 (7%) (200 Å), Alq$_3$ (300 Å), LiF (5 Å) and Al (1,000 Å) were sequentially deposited on the ITO glass substrate to fabricate an organic EL device.

The luminance of the organic EL device was 1,320 cd/m2 at an electric current of 0.9 mA and a voltage of 5.8 V. At this time, the CIE chromaticity coordinates were x=0.621 and y=0.336. The lifetime (defined as the time taken before the luminance of the organic EL device decreases to half its initial value) of the organic EL device was 4,000 hours at 2,000 cd/m$^2$.

Example 4

An ITO-coated glass substrate was patterned to have a light-emitting area of 3 mm×3 mm, followed by cleaning. The patterned substrate was disposed in a vacuum chamber. Then, the standard pressure of the chamber was adjusted to 1×10$^{-6}$ torr. CuPc (200 Å), NPD (400 Å), BAlq+A-7 (7%) (200 Å), Alq$_3$ (300 Å), LiF (5 Å) and Al (1,000 Å) were sequentially deposited on the ITO glass substrate to fabricate an organic EL device.

The luminance of the organic EL device thus fabricated was 1,350 cd/m$^2$ at an electric current of 0.9 mA and a voltage of 5.7 V. At this time, the CIE chromaticity coordinates were x=0.610, y=0.329. The lifetime (defined as the time taken before the luminance of the organic EL device decreases to half its initial value) of the organic EL device was 4,100 hours at 2,000 cd/m$^2$.

Comparative Example

An ITO-coated glass substrate was patterned to have a light-emitting area of 3 mm×3 mm, followed by cleaning. The patterned substrate was disposed in a vacuum chamber. Then, the standard pressure of the chamber was adjusted to 1×10$^{-6}$ torr. CuPc (200 Å), NPD (400 Å), BAlq+(btp)$_2$Ir (acac) (7%) (200 Å), Alq$_3$ (300 Å), LiF (5 Å) and Al (1,000 Å) were sequentially deposited on the ITO glass substrate to fabricate an organic EL device.

The luminance of the organic EL device thus fabricated was 780 cd/m$^2$ at an electric current of 0.9 mA and a voltage of 7.5 V. At this time, the CIE chromaticity coordinates were x=0.659 and y=0.329. The lifetime (defined as the time taken before the luminance of the organic EL device decreases to half its initial value) of the organic EL device was 2,500 hours at 2,000 cd/m$^2$.

The organic EL devices fabricated in Examples 1 to 4 and Comparative Example 1 were evaluated for efficiency, CIE chromaticity coordinates, luminance and lifetime characteristics. The results are shown in Table 1.

TABLE 1

| Device | Voltage (V) | Electric current (mA) | Luminance (cd/m²) | Current efficiency (cd/A) | Power efficiency (lm/W) | CIE (X) | CIE (Y) | Life time (h) (half the initial luminance) |
|---|---|---|---|---|---|---|---|---|
| Ex. 1 | 6.1 | 0.9 | 1326 | 13.26 | 6.83 | 0.601 | 0.327 | 3700 |
| Ex. 2 | 5.7 | 0.9 | 1420 | 14.20 | 7.82 | 0.592 | 0.330 | 4200 |
| Ex. 3 | 5.8 | 0.9 | 1411 | 14.11 | 7.64 | 0.621 | 0.336 | 4000 |
| Ex. 4 | 5.7 | 0.9 | 1350 | 13.50 | 7.44 | 0.610 | 0.329 | 4100 |
| Comp. Ex. | 7.5 | 0.9 | 780 | 7.8 | 3.3 | 0.659 | 0.329 | 2500 |

The organic EL devices fabricated in Examples 1 to 4 comprise a light-emitting layer which uses the red phosphorescent compound of Formula 1 as a dopant. When a voltage of 5.7 to 6.1 V is applied to the organic EL device, the electric current of the organic EL device was 0.8 to 1 mA, and the luminance of the organic EL was 1,300 to 1,450 cd/m². The electric current of 0.8 to 1 mA corresponds to a current density of 8 to 10 mA/cm². The organic EL device exhibited a lifetime of 3,500 to 4,500. The lifetime is defined as the time taken before the luminance of the organic EL device decreases to half its initial value. The organic EL device had a current efficiency of 10 to 15 cd/A and a power efficiency of 6 to 8 lm/W.

As apparent from the foregoing, in the organic electroluminescent (EL) device according to the present invention, the red phosphorescent compound of Formula 1 is used as a dopant for the light-emitting layer. As a result, there can be obtained an organic electroluminescent (EL) device exhibiting excellent color purity, high luminescence efficiency, and long luminescence lifetime, when compared to conventional organic electroluminescent (EL) devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic electroluminescent (EL) device comprising a sequential laminate of
an anode,
a hole injecting layer,
a hole transport layer,
an electron transport layer,
an electron injecting layer, and
a cathode,
with a light-emitting layer interposed between the hole transport layer and the electron transport layer,
wherein a red phosphorescent compound is used as a dopant for the light-emitting layer,
wherein the red phosphorescent compound is selected from the group consisting of A-1 to A-12 and B-1 to B-12 as follows, and
wherein the light-emitting layer uses Zn complexes as a host, wherein the Zn complexes have at least one ligand selected from the group consisting of methylquinolinol and dinnethylquinolinol;

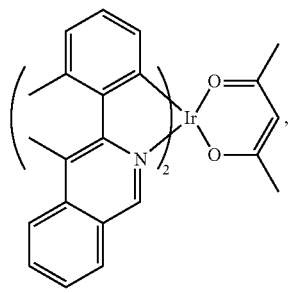 A-1

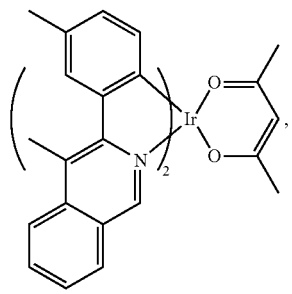 A-2

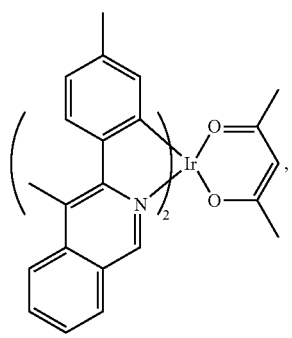 A-3

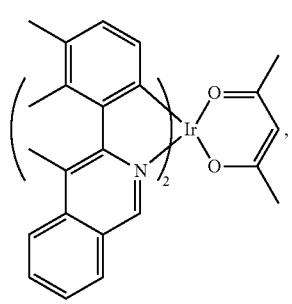 A-4

A-5
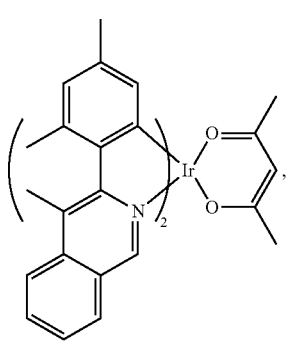
A-6
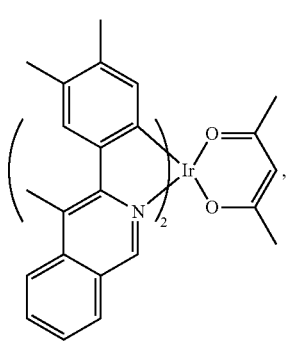
A-7
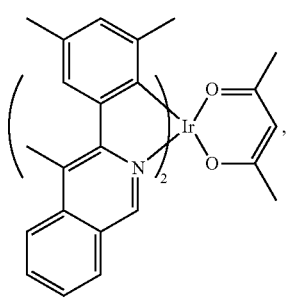
A-8
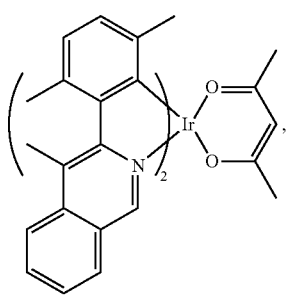
A-9
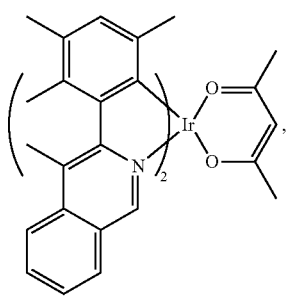
A-10
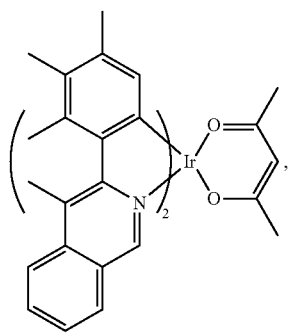
A-11
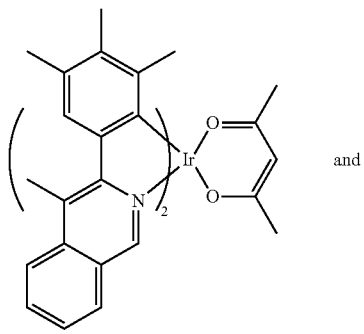
and
A-12
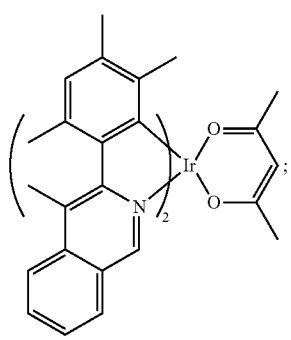
B-1
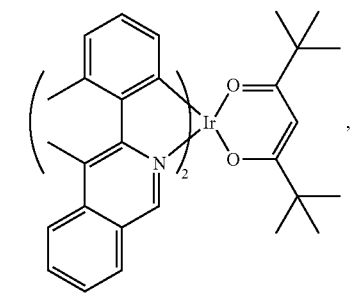
B-2
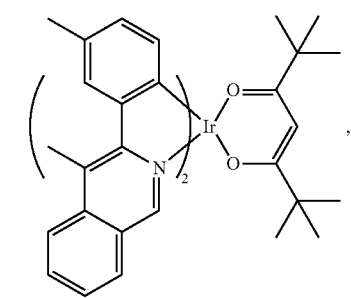

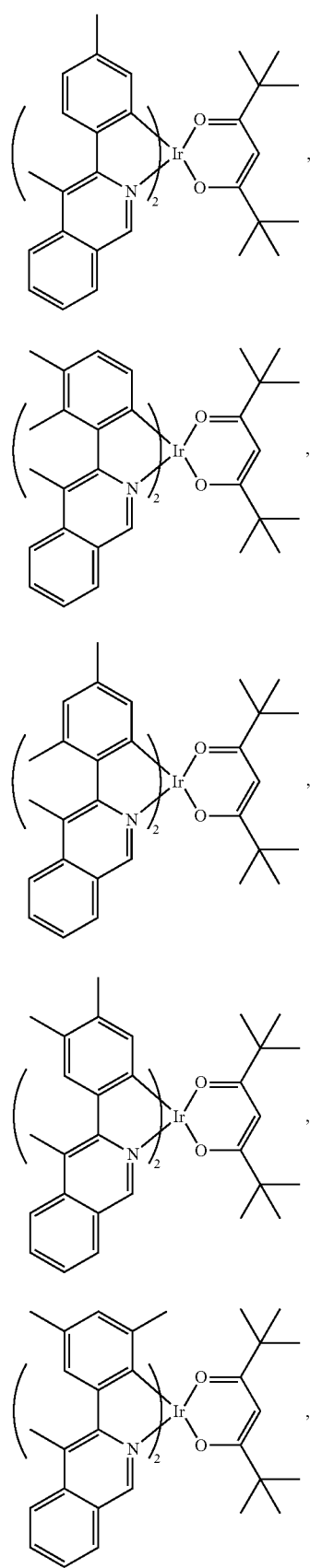
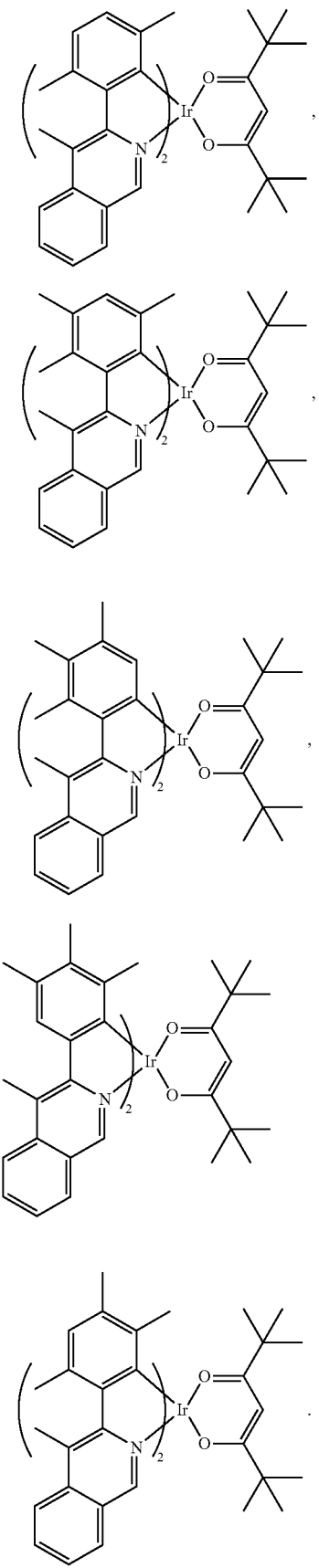

2. The organic electroluminescent (EL) device according to claim 1, wherein the dopant is used in an amount of 0.5 to 20% by weight, based on the weight of the light-emitting layer.

3. An organic electroluminescent (EL) device comprising a first electrode, a light-emitting layer using a red phosphorescent compound as a dopant, and a second electrode, and exhibiting a luminescence of 1,300 to 1,450 cd/m² and an electric current density of 8 to 10 mA/cm² at an applied voltage of 5.7 to 6.1 V and wherein the dopant is a red phosphorescent compound selected from the group consisting of A-1 to A-12 and B-1 to B-12 as follows, and wherein the light-emitting layer uses Zn complexes as a host, and wherein the Zn complexes have at least one ligand selected from the group consisting of methylquinolinol and dimethylquinolinol;

A-1

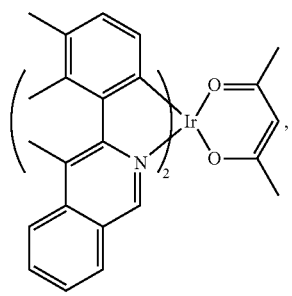

A-2

A-3

A-4

A-5

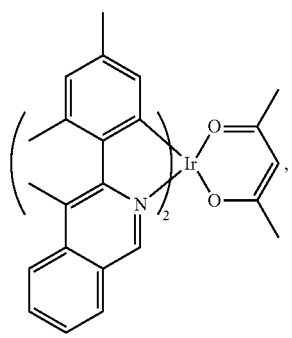

A-6

A-7

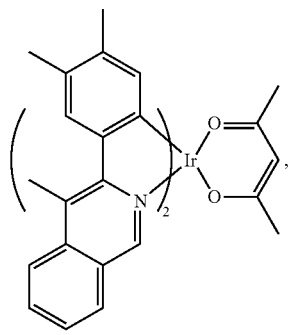

A-8

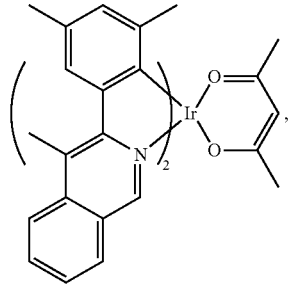

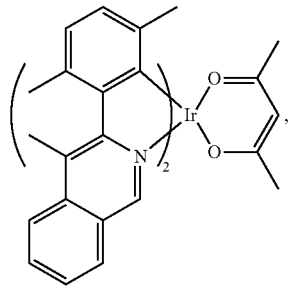

A-9
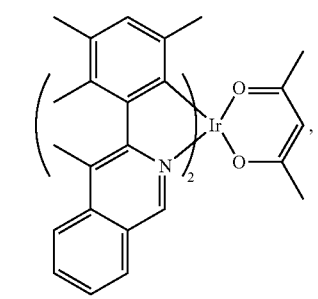
A-10
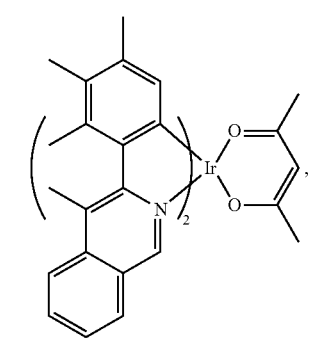
A-11
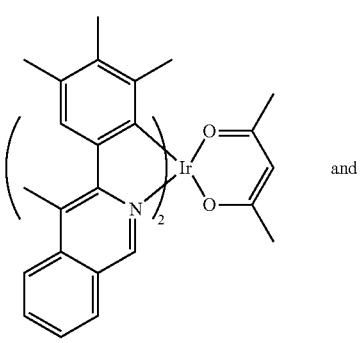
and
A-12
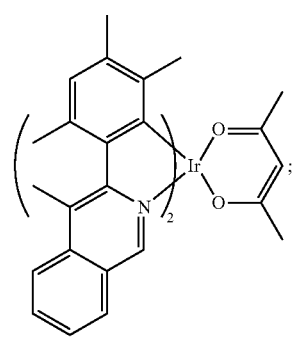
;
B-1
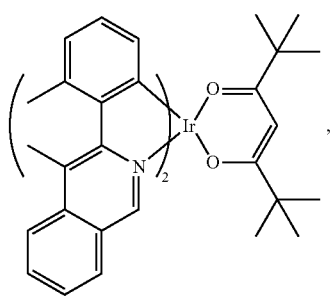
,
B-2
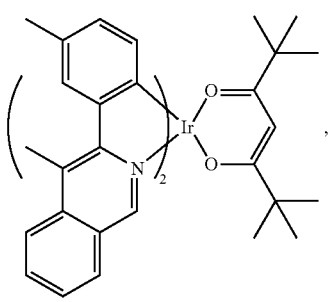
,
B-3
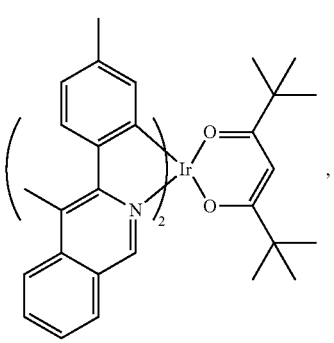
,
B-4
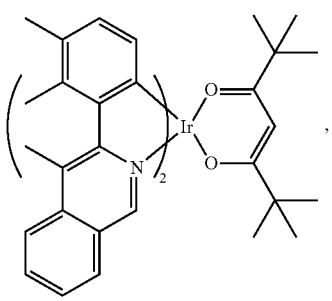
,
B-5
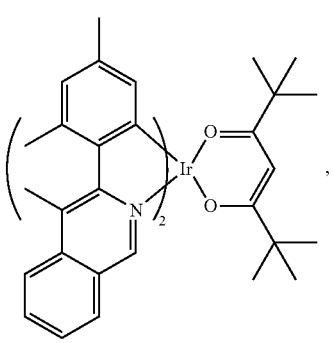
,
B-6
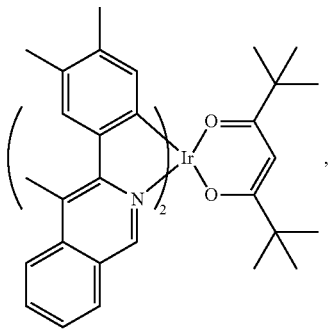
, -continued B-7 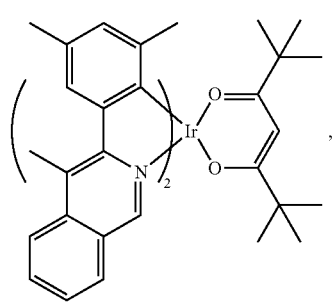

B-8 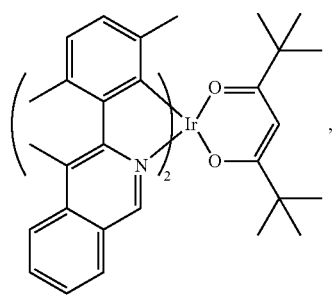

B-9 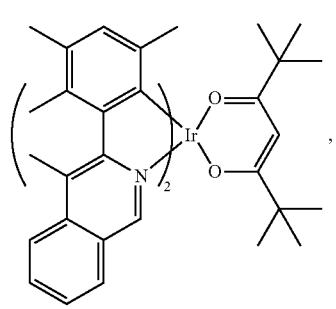

B-10 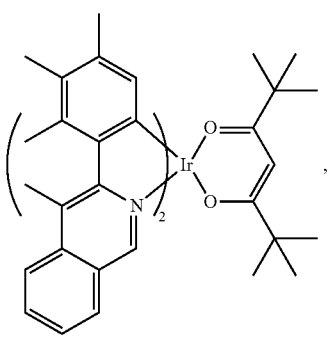

B-11 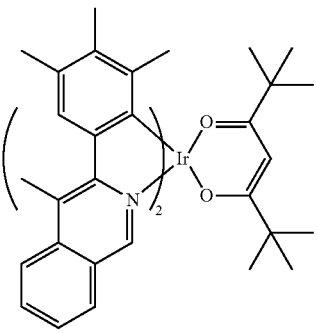 and

B-12 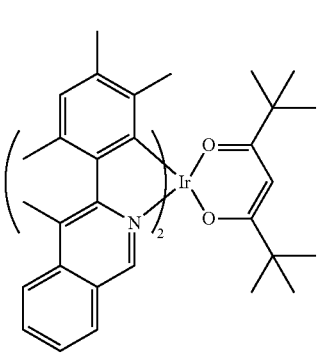

4. The organic electroluminescent (EL) device according to claim 3, wherein the device has a lifetime of 3,500 to 4,500 hours, wherein the lifetime is defined as the time taken before the luminance of the organic EL device decreases to half its initial value.

5. The organic electroluminescent (EL) device according to claim 3, wherein the device has a current efficiency of 10 to 15 cd/A.

6. The organic electroluminescent (EL) device according to claim 3, wherein the device has a power efficiency of 6 to 8 lm/W.

7. The organic electroluminescent (EL) device according to claim 3, wherein the dopant is used in an amount of 0.5 to 20% by weight, based on the weight of the light-emitting layer.

* * * * *